US012804812B2

(12) United States Patent
Lou et al.

(10) Patent No.: US 12,804,812 B2
(45) Date of Patent: Nov. 17, 2026

(54) SIGNAL VIA OFFSET ARRANGEMENT FOR PRINTED CIRCUIT BOARD

(71) Applicant: Cisco Technology, Inc., San Jose, CA (US)

(72) Inventors: Jianquan Lou, Shanghai (CN); Alpesh Umakant Bhobe, Sunnyvale, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 250 days.

(21) Appl. No.: 18/601,196

(22) Filed: Mar. 11, 2024

(65) Prior Publication Data

US 2025/0287503 A1 Sep. 11, 2025

(51) Int. Cl.
*H05K 1/02* (2006.01)
*H05K 1/11* (2006.01)

(52) U.S. Cl.
CPC ........... *H05K 1/115* (2013.01); *H05K 1/0228* (2013.01); *H05K 1/113* (2013.01); *H05K 2201/09527* (2013.01)

(58) Field of Classification Search
CPC .... H05K 1/115; H05K 1/0228; H05K 1/0245; H05K 1/113; H05K 2201/09527; H05K 2201/09272
See application file for complete search history.

(56) References Cited

U.S. PATENT DOCUMENTS 10,054,979 B1 8/2018 Liao et al.
2003/0047348 A1* 3/2003 Jessep .................... H05K 1/114 174/250
2005/0162839 A1* 7/2005 Chan .................... H05K 1/0231 361/782
2006/0232301 A1* 10/2006 Morlion ................. H05K 1/114 326/126
2013/0056253 A1 3/2013 Biddle et al.
2013/0333933 A1 12/2013 Mantiply et al.
2015/0359084 A1* 12/2015 Kashiwakura ....... H05K 1/0253 29/852
2016/0205770 A1* 7/2016 Popovic ............... H01R 43/205 29/842
2018/0177043 A1 6/2018 Li et al.
2019/0289710 A1 9/2019 Kumar et al.
2021/0281017 A1 9/2021 Yokota et al.

* cited by examiner

*Primary Examiner* — Roshn K Varghese
(74) *Attorney, Agent, or Firm* — Edell, Shapiro & Finnan, LLC

(57) ABSTRACT

An apparatus that includes a layer of a printed circuit board and a first pair of signal vias and a second pair of signal vias each formed through the layer. The first pair of signal vias includes a first signal via and a second signal via that are offset along a first axis and aligned along a second axis, perpendicular to the first axis. The second pair of signal vias includes a third signal via and a fourth signal via that are offset along the first axis and aligned along the second axis. The pairs of signal vias are offset along the first axis and along the second axis such that a first distance between the third signal via and the first signal via is different from a second distance between the third signal via and the second signal via.

20 Claims, 7 Drawing Sheets

SIGNAL VIA OFFSET ARRANGEMENT FOR PRINTED CIRCUIT BOARD

TECHNICAL FIELD

The present disclosure relates to printed circuit boards (PCBs).

BACKGROUND

A printed circuit board (PCB) electrically couples various electronic components with one another. For example, a PCB may include multiple layers, each having different electronic components and traces routed along the layers to electrically couple electronic components of the same layer. Additionally, the PCB may include vias that extend between layers to electrically couple electronic components of different layers to one another. For instance, a signal may propagate from a first electronic component of a first layer, through a first trace routed along the first layer, through a via extending from the first layer to a second layer, through a second trace routed along the second layer, and to an electronic component of the second layer. Unfortunately, the PCB may be subject to crosstalk in which transmitted signals interfere with one another. For example, electric fields emitted by vias during signal transmission may overlap with one another to cause via-to-via crosstalk. Interference between signals may increase signal loss, thereby reducing signal integrity during signal transmission.

DETAILED DESCRIPTION

Overview

Figure 1:
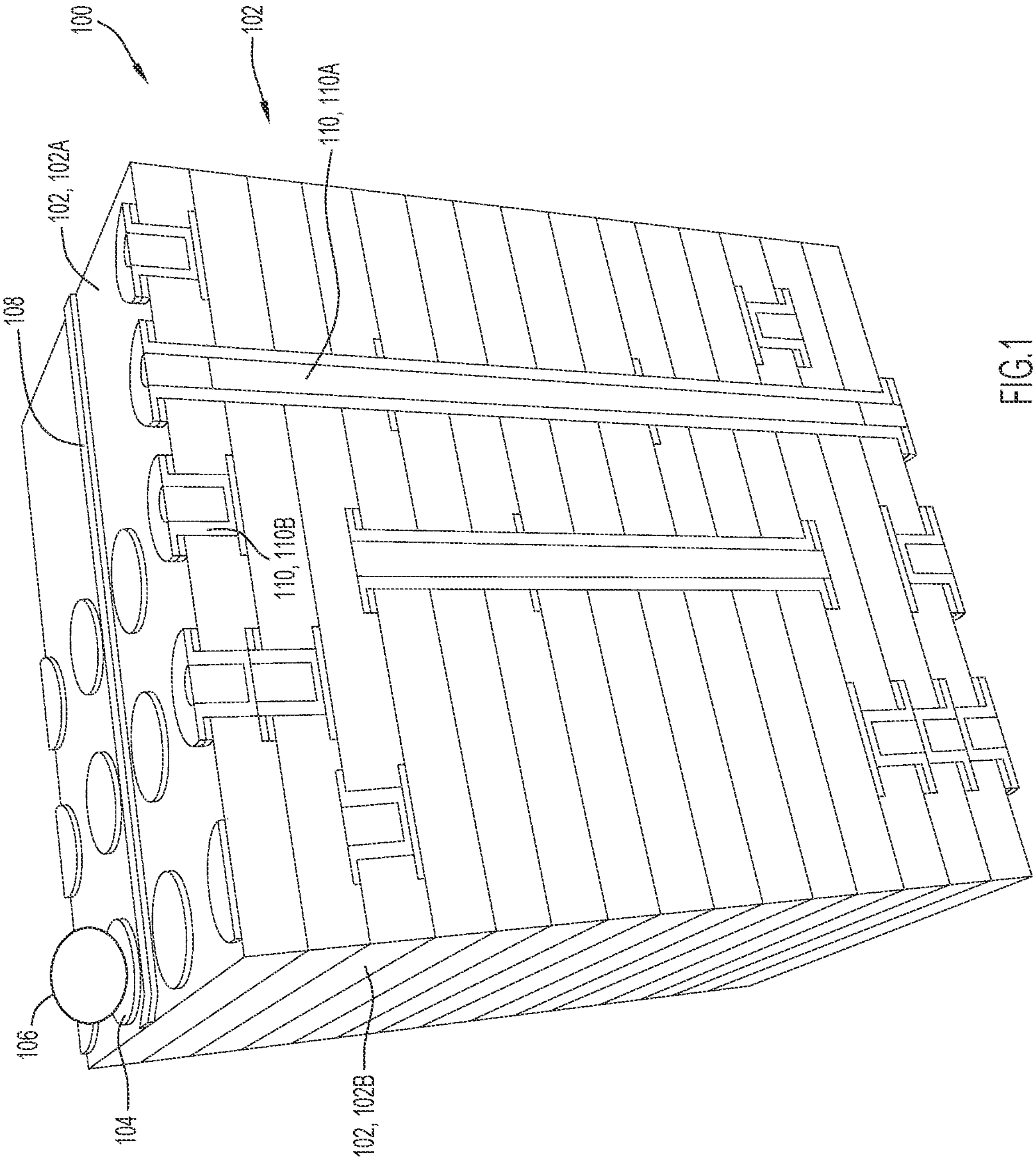
FIG. 1 is a perspective cross-sectional view of a printed circuit board (PCB) that includes multiple layers, according to an example embodiment.

Techniques are provided herein for reducing crosstalk between signal vias. In some aspects, the techniques described herein relate to an apparatus including: a layer of a printed circuit board; a first pair of signal vias formed through the layer, wherein the first pair of signal vias is configured to transmit respective signals, the first pair of signal vias comprises a first signal via and a second signal via offset from one another along a first axis and aligned with one another along a second axis, perpendicular to the first axis; and a second pair of signal vias formed through the layer, wherein the second pair of signal vias is configured to transmit respective signals, the second pair of signal vias comprises a third signal via and a fourth signal via offset from one another along the first axis and aligned with one another along the second axis, and the first pair of signal vias and the second pair of signal vias are offset from one another along the first axis and along the second axis such that a first distance between the third signal via and the first signal via is different from a second distance between the third signal via and the second signal via.

According to other aspects, the techniques described herein relate to an apparatus including: a layer of a printed circuit board; and a plurality of signal vias formed through the layer and configured to transmit respective signals, wherein the plurality of signal vias comprises: a first signal via; a second signal via immediately adjacent to the first signal via along a first axis; a third signal via immediately adjacent to the first signal via along a second axis, perpendicular to the first axis; and a fourth signal via immediately adjacent to the third signal via along the first axis, wherein the first signal via, the second signal via, the third signal via, and the fourth signal via are arranged in a parallelogram configuration, and a first distance between the first signal via and the third signal via is different from a second distance between the second signal via and the third signal via.

In still other aspects, the techniques described herein relate to an apparatus including: a layer of a printed circuit board; and a plurality of signal vias formed through the layer and configured to transmit respective signals, wherein the plurality of signal vias comprises: a first signal via; a second signal via offset from the first signal via along a first axis and aligned with the first signal via along a second axis, perpendicular to the first axis; a third signal via offset from the first signal via and the second signal via along the first axis and along the second axis; and a fourth signal via offset from the third signal via along the first axis and aligned with the third signal via along the second axis, wherein a first distance between the first signal via and the third signal via, a second distance between the first signal via and the second signal via, and a third distance between the second signal via and the third signal via are different from one another, and the second distance between the first signal via and the second signal via is substantially equal to a fourth distance between the third signal via and the fourth signal via.

Example Embodiments

Embodiments of the present disclosure are directed to a printed circuit board (PCB) having signal vias formed at a layer of the PCB and arranged to reduce crosstalk. Each signal via may be configured to transmit a respective signal, such between layers of the PCB. As such, components at different layers of the PCB may communicate with one another using the signal transmitted through the signal vias.

The layer of the PCB may include a first pair of signal vias that has a first signal via and a second signal via offset from one another along a first axis and aligned with one another along a second axis, perpendicular to the first axis. The layer of the PCB may also include a second pair of signal vias that has a third signal via and a fourth signal via offset from one another along the first axis and aligned with one another along the second axis. The first pair of signal vias and the second pair of signal vias are offset from one another along the first axis and along the second axis such that a first distance between the third signal via and the first signal via is different from a second distance between the third signal via and the second signal via.

Such an arrangement between the first pair of signal vias and the second pair of signal vias may reduce crosstalk between the pairs of signal vias. For instance, the provided offset between the pairs of signal vias may reduce an overlap of electric fields emitted by the pairs of signal vias during signal transmission. As a result, integrity of the signals transmitted by the pairs of signal vias may be improved.

With reference made to FIG. 1, depicted therein is a cross-sectional view of a PCB 100 having multiple layers 102. Each layer 102 may include different electronic components that are electrically coupled to one another. By way of example, a first layer 102A (e.g., a top layer) may include multiple pads 104 that are exposed to an exterior environment of the PCB 100. The pads 104 may enable electrical coupling of the PCB 100 to a separate component, such as an integrated circuit (IC) (e.g., an application-specific IC (ASIC)). For example, an interconnect 106, such as a solder ball, may be used to electrically couple one of the pads 104 to the separate component. A trace 108 may also be electrically coupled to the pad 104 and routed along the first layer 102A to electrically couple the pad 104, and therefore the interconnect 106 and the separate component electrically coupled to the pad 104, to an electronic component (e.g., another IC, a resistor, a transistor, a capacitor, a switch, an inductor, a transformer, a sensor, a diode, a relay) of the first layer 102A.

Moreover, the PCB 100 may include signal vias 110 that extend through multiple layers 102 of the PCB 100 to electrically couple electronic components of different layers 102 to one another. For instance, a first signal via 110A may be electrically coupled to the pad 104 that is electrically coupled to the interconnect 106, and the first signal via 110A may extend from the first layer 102A to a second layer 102B (e.g., an inner layer, a mid layer) of the PCB 100. A trace (not shown) routed along the second layer 102B may be electrically coupled to the first signal via 110A and to an electronic component of the second layer 102B. As such, the first signal via 110A may help electrically couple the electronic component of the second layer 102B to the electronic component of the first layer 102A and/or to the separate component electrically coupled to the pad 104.

By way of example, during operation of the PCB 100, a signal may be transmitted between the electronic component of the first layer 102A, the electronic component of the second layer 102B, and/or the separate component electrically coupled to the PCB 100. For instance, the separate component may transmit the signal to the pad 104 by way of the interconnect 106, and the signal may propagate through the trace 108 secured/connected to the pad 104 and routed along the first layer 102A toward the electronic component of the first layer 102A and/or through the first signal via 110A toward the second layer 102B, through the trace routed along the second layer 102B and electrically coupled to the first signal via 110A, and toward the electronic component of the second layer 102B.

However, an integrity of the signal propagated through the first signal via 110A may be reduced as a result of electrical field interferences. For example, a second signal via 110B may extend from the first layer 102A and may also be configured to transmit a signal. During signal transmission, the signal vias 110 may emit respective electrical fields toward one another. That is, the first signal via 110A may emit an electrical field toward the second signal via 110B, and the second signal via 110B may emit an electrical field toward the via 110A. Overlap between the electrical fields may cause crosstalk that reduces an integrity of the signals transmitted through the signal vias 110. Consequently, operation of the PCB 100 using the signals may be affected.

For this reason, the signal vias 110 may be arranged in a manner to achieve desirable signal integrity. By way of example, the signal vias 110 are offset at particular distances that reduce an overlap in their emitted electrical fields without substantially increasing a total area occupied by the signal vias 110. As such, the offset arrangement of the signal vias 110 may increase signal integrity while still enabling the signal vias 110 to efficiently occupy the PCB 100. For example, the signal vias 110 can be densely positioned (e.g., positioned adjacent to one another) at the first layer 102A without reducing signal integrity.

Figure 2:
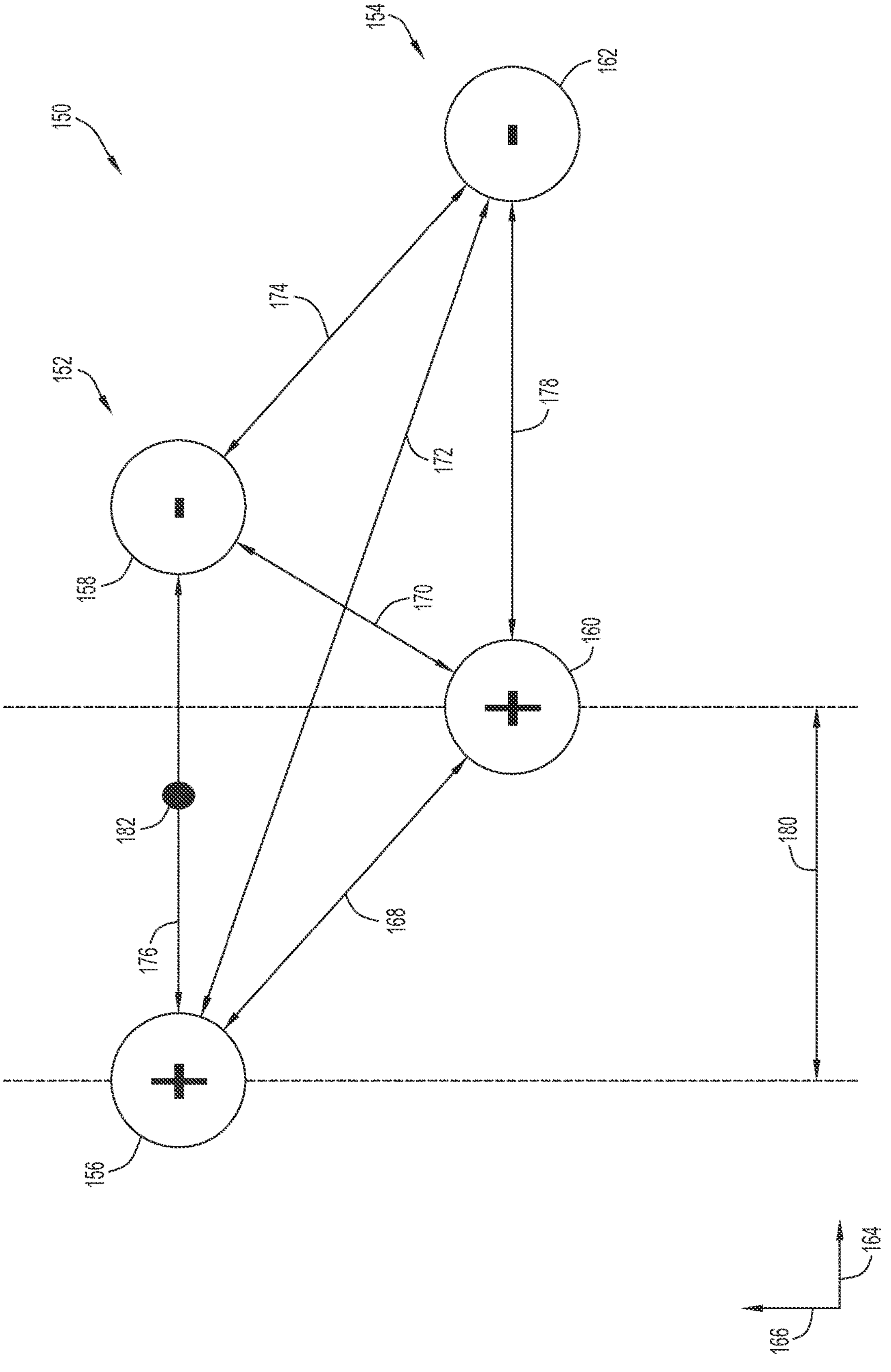
FIG. 2 is a schematic diagram of signal vias in an offset arrangement at a PCB layer, according to an example embodiment.

FIG. 2 is a schematic diagram of a layer 150 of a PCB, such as the first layer 102A of the PCB 100. The layer 150 may include a first pair of signal vias 152 and a second pair of signal vias 154. The first pair of signal vias 152 may include a first signal via 156 and a second signal via 158 configured to transmit respective signals, and the second pair of signal vias 154 may include a third signal via 160 and a fourth signal via 162 configured to transmit respective signals. For instance, the first signal via 156 and the second signal via 158 are a differential pair configured to transmit related signals (e.g., a positive signal, a negative signal), and the third signal via 160 and the fourth signal via 162 are another differential pair, separate from the first pair of signal vias 152, also configured to transmit related signals (e.g., a positive signal, a negative signal). The first signal via 156 and the second signal via 158 are offset from and immediately adjacent to one another along a first axis 164 (e.g., a longitudinal axis) and aligned with one another along a second axis 166 (e.g., a lateral axis), perpendicular to the first axis 164. Similarly, the third signal via 160 and the fourth signal via 162 are offset from and immediately adjacent to one another along the first axis 164 and aligned with one another along the second axis 166.

Additionally, the first pair of signal vias 152 and the second pair of signal vias 154 are immediately adjacent to one another along the second axis 166. That is, the first signal via 156 and the third signal via 160 may be immediately adjacent to one another along the second axis 166, and the second signal via 158 and the fourth signal via 162 may be immediately adjacent to one another along the second axis 166. However, the pairs of signal vias 152, 154 may be offset from one another along the first axis 164 and along the second axis 166. The offset between the pairs of signal vias 152, 154 may cause the third signal via 160 to be positioned at a first distance 168 away from the first signal via 156 and at a second distance 170 away from the second signal via 158 and cause the fourth signal via 162 to be positioned at a third distance 172 away from the first signal via 156 and at a fourth distance 174 away from the second signal via 158. By way of example, the first distance 168 may be greater than the second distance 170 and the third distance 172 may be greater than the fourth distance 174. In any case, each of the distances 168, 170, 172, 174 may extend obliquely relative to the first axis 164 and the second axis 166.

Additionally, the first signal via 156 and the second signal via 158 may be positioned at a fifth distance 176 away from one another along the first axis 164, and the third signal via 160 and the fourth signal via 162 may be positioned at a sixth distance 178 away from one another along the first axis 164. In certain embodiments, the fifth distance 176 and the sixth distance 178 may be substantially equal to one another (e.g., greater than the second distance 170), and the first distance 168 and the fourth distance 174 may therefore be substantially equal to one another, to arrange the pairs of signal vias 152, 154 in a parallelogram configuration in which each of the signal vias 156, 158, 160, 162 are positioned at a respective corner of a cooperatively formed parallelogram shape. However, the first distance 168, the second distance 170, and the fifth distance 176 may be substantially different from one another, and the second distance 170, the fourth distance 174, and the sixth distance 178 may be substantially different from one another. Such positioning of the signal vias 156, 158, 160, 162 may reduce crosstalk therebetween, such as by reducing overlap between their respective electrical fields.

To position the pairs of signal vias 152, 154 in the illustrated arrangement, the third signal via 160 may be positioned away from the first signal via 156 along the first axis 164 by an offset distance 180. As an example, positioning the third signal via 160 at the offset distance 180 away from the first signal via 156 may reduce noise associated with energy having a particular frequency (e.g., below a threshold value) to limit crosstalk. The offset distance 180 may be offset from a midpoint 182 between the first signal via 156 and the second signal via 158 along the first axis 164. For instance, the third signal via 160 may be positioned more adjacent to the second signal via 158 than to the first signal via 156 along the first axis 164. However, the exact offset distance 180 may differ for different implementations to limit a desirable amount of crosstalk. For example, different operating parameters/conditions, such as a signal transmission rate, a signal via size, noise frequency, a PCB layer arrangement, and so forth related to the PCB, may adjust the offset distance 180 providing a sufficiently low amount of crosstalk between the signal vias 156, 158, 160, 162. In any case, the offset distance 180 is established to provide a low overall amount of noise coupling between the signal vias 156, 158, 160, 162. In other words, the signal vias 156, 158, 160, 162 are arranged such that the amount of noise produced by one of the pairs of signal vias 152, 154 (i.e., the aggressor pair) and affecting the other of the pairs of signal vias 152, 154 (i.e., the victim pair) is low (e.g., below a threshold value).

As an example, during operation, the first signal via 156 may produce a first amount (e.g., a positive amount) of noise coupling with respect to the third signal via 160 and a second amount (e.g., a positive amount) of noise coupling with respect to the fourth signal via 162. Additionally, the second signal via 158 may produce a third amount (e.g., a negative amount) of noise coupling with respect to the third signal via 160 and a fourth amount of noise coupling (e.g., a negative amount) with respect to the fourth signal via 162. The offset distance 180 may be established such that a first sum of the first amount of noise coupling plus the third amount of noise coupling is substantially equal to a second sum of the second amount of noise coupling plus the fourth amount of noise coupling. Such an offset distance 180 may be a value between 0.66 millimeters (mm) and 0.75 mm (e.g., between 0.026 inches and 0.03 inches).

In certain embodiments, the signal vias 156, 158, 160, 162 may be configured to directly mount to (e.g., using a soldering technique) corresponding pins of a separate component, such as an integrated circuit (IC). To this end, the pins of the separate component are arranged in a corresponding manner as the illustrated arrangement of the signal vias 156, 158, 160, 162 (e.g., the pins are offset along the first axis and along the second axis in the same manner) to enable the pins to align with the signal vias 156, 158, 160, 162. As a result, the signals may be transmitted between the layer 150 and the separate component by way of the signal vias 156, 158, 160, 162.

Figure 3:
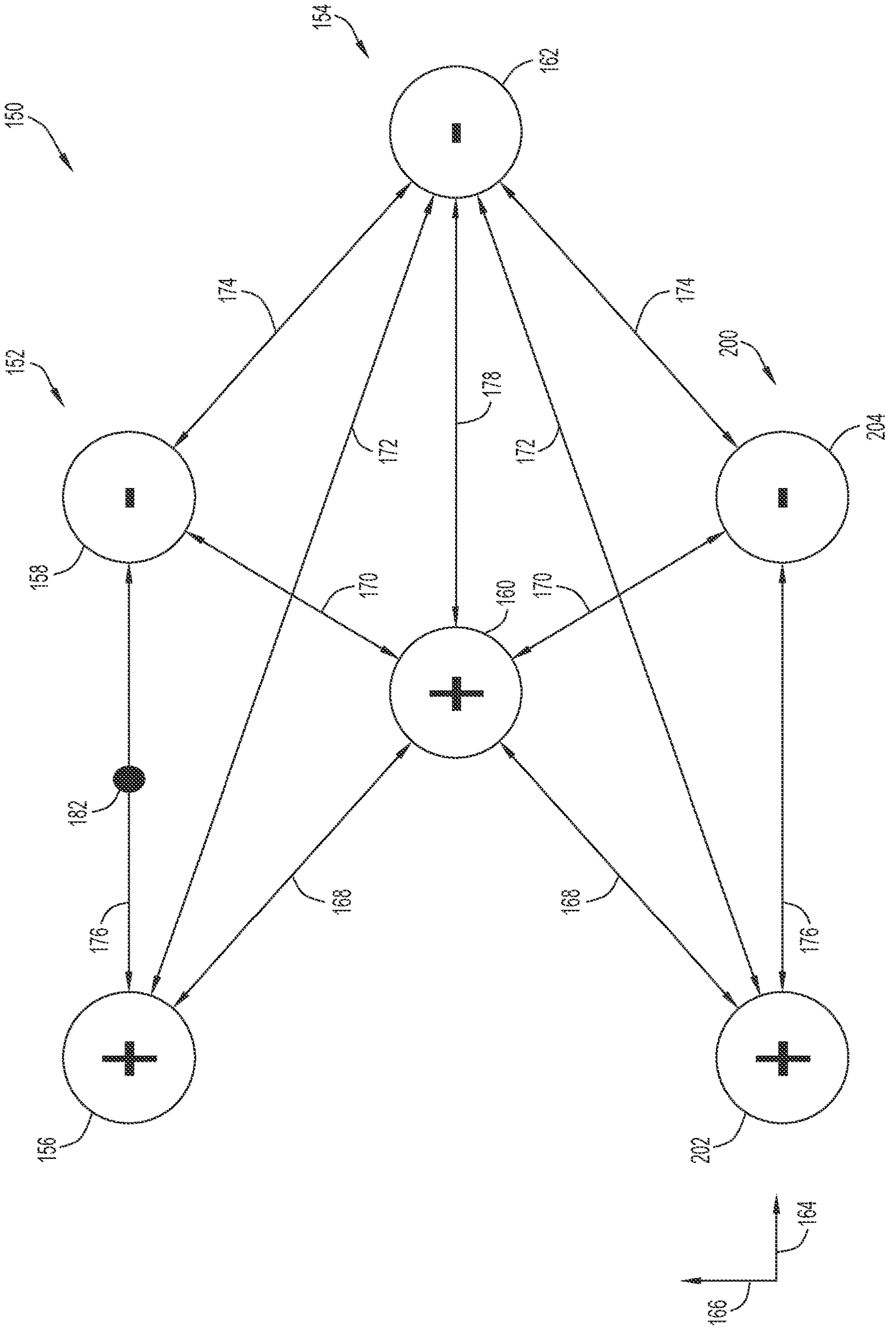
FIG. 3 is a schematic diagram of signal vias in an offset arrangement at a PCB layer, according to an example embodiment.

FIG. 3 is a schematic diagram of the layer 150 having the first pair of signal vias 152, the second pair of signal vias 154, and a third pair of signal vias 200. The third pair of signal vias 200 may be immediately adjacent to the second pair of signal vias 154 along the second axis 166, and the third pair of signal vias 200 may include a fifth signal via 202 and a sixth signal via 204 that are offset from one another along the first axis 164 and aligned with one another along the second axis 166. Moreover, the third pair of signal vias 200 may be offset from the second pair of signal vias 154 along the first axis 164 and along the second axis 166. As an example, the third pair of signal vias 200 may be aligned with the first pair of signal vias 152 along the first axis 164.

For instance, the fifth signal via 202 may be positioned at the first distance 168 away from the third signal via 160 and at the third distance 172 away from the fourth signal via 162, and the sixth signal via 204 may be positioned at the second distance 170 away from the third signal via 160 and at the fourth distance 174 away from the fourth signal via 162. As such, the first pair of signal vias 152 and the third pair of signal vias 200 may be symmetrical about the second pair of signal vias 154 such that the third signal via 160 may be equidistant to the first signal via 156 and to the fifth signal via 202 and equidistant to the second signal via 158 and to the sixth signal via 204, and the fourth signal via 162 may be equidistant to the first signal via 156 and to the fifth signal via 202 and equidistant to the second signal via 158 and to the sixth signal via 204. However, in alternative embodiments, the first pair of signal vias 152 and the third pair of signal vias 200 may not be symmetrical about the second pair of signal vias 154. As an example, the third pair of signal vias 200 may be aligned with the first pair of signal vias 152 along the first axis 164 but offset along the second axis 166 such that the third signal via 160 is not equidistant to the first signal via 156 and the fifth signal via 202 (e.g., the third signal via 160 is positioned more adjacent to the first signal via 156 than to the fifth signal via 202). As another example, the third pair of signal vias 200 may not be aligned with the first pair of signal vias along the first axis 164. Instead, for instance, the third pair of signal vias 200 may be offset from each of the first pair of signal vias 152 and the second pair of signal vias 154 along the first axis 164 such that the first signal via 156, the third signal via 160, and the fifth signal via 202 are collinear along an axis extending obliquely to the first axis 164 and the second axis 166.

Figure 4:
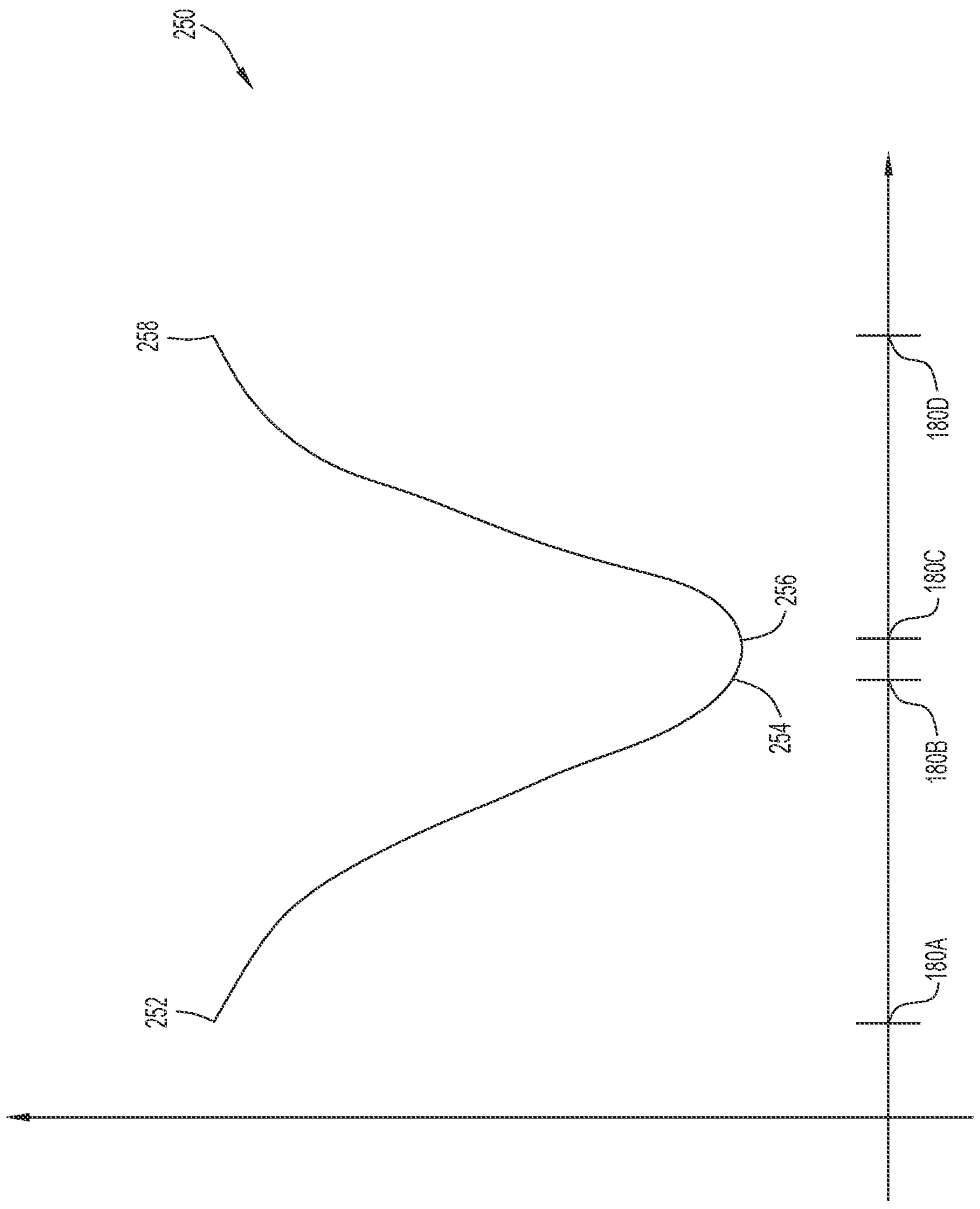
FIG. 4 is a graph illustrating measurements of crosstalk between signal vias at different offset arrangements, according to an example embodiment.

FIG. 4 illustrates a graph 250 depicting a relationship between the offset distance 180 and a measurement of total crosstalk (e.g., a summation of the amounts of noise coupling) between the two pairs of signal vias 152, 154, with reference to FIGS. 2 and 3. That is, the graph 250 indicates an amount of crosstalk between the first pair of signal vias 152 and the second pair of signal vias 154 caused by varying offset distances 180 between the first signal via 156 and the third signal via 160 along the first axis 164. For instance, a first offset distance 180A in which the first pair of signal vias 152 and the second pair of signal vias 154 are aligned along the first axis 164 may cause a first crosstalk amount 252 (e.g., a high crosstalk amount, a maximum crosstalk amount). Increasing the offset distance 180 between the first pair of signal vias 152 and the second pair of signal vias 154 along the first axis 164 from the first offset distance 180A may reduce the amount of crosstalk from the first crosstalk amount 252. A second offset distance 180B in which the third signal via 160 is aligned with the midpoint 182 along the first axis 164 (i.e., the third signal via 160 is positioned midway between the first signal via 156 and the second signal via 158 along the first axis 164) may cause a second crosstalk amount 254 (e.g., an intermediate crosstalk amount). Further increasing the offset distance 180 between the first pair of signal vias 152 and the second pair of signal vias 154 along the first axis 164 from the second offset distance 180B may further reduce the amount of crosstalk from the second crosstalk amount 254. For example, a third offset distance 180C in which the third signal via 160 is positioned more adjacent to the second signal via 158 than to the first signal via 156 along the first axis 164 may cause a third crosstalk amount 256 (e.g., a low crosstalk amount, a minimum crosstalk amount). Increasing the offset distance 180 between the first pair of signal vias 152 and the second pair of signal vias 154 along the first axis 164 from the third offset distance 180C may then increase the amount of crosstalk from the third crosstalk amount 256. By way of example, a fourth offset distance 180D in which the third signal via 160 is aligned with the second signal via 158 may cause a fourth crosstalk amount 258, which may be substantially equal to the first crosstalk amount 252.

Thus, as shown in the graph 250, an arrangement in which the third signal via 160 is not positioned midway between the first signal via 156 and the second signal via 158 (e.g., such that the first distance 168 between the first signal via 156 and the third signal via 160, the second distance 170 between the second signal via 158 and the third signal via 160, and the fifth distance 176 between the first signal via 156 and the second signal via 158 are different from one another) may reduce crosstalk to the greatest extent. As an example, the third offset distance 180C may be a value between 0.66 mm and 0.75 mm (e.g., between 0.026 inches and 0.03 inches), whereas the fifth distance 176 between the first signal via 156 and the second signal via 158 may be a value between 0.8 mm and 1 mm (e.g., between 0.027 inches to 0.039 inches). It should be noted that for different implementations, a different graph may depict the relationship between an offset distance and an amount of crosstalk. For instance, the rate at which the amount of crosstalk increases and decreases may vary for the different graphs. However, for each graph, a particular offset distance (e.g., an offset distance misaligned with a corresponding midway point along the first axis 164) may cause the lowest amount of crosstalk, and pairs of signal vias may be arranged based on the particular offset distance to limit crosstalk and maintain desirable signal integrity.

Figure 5:
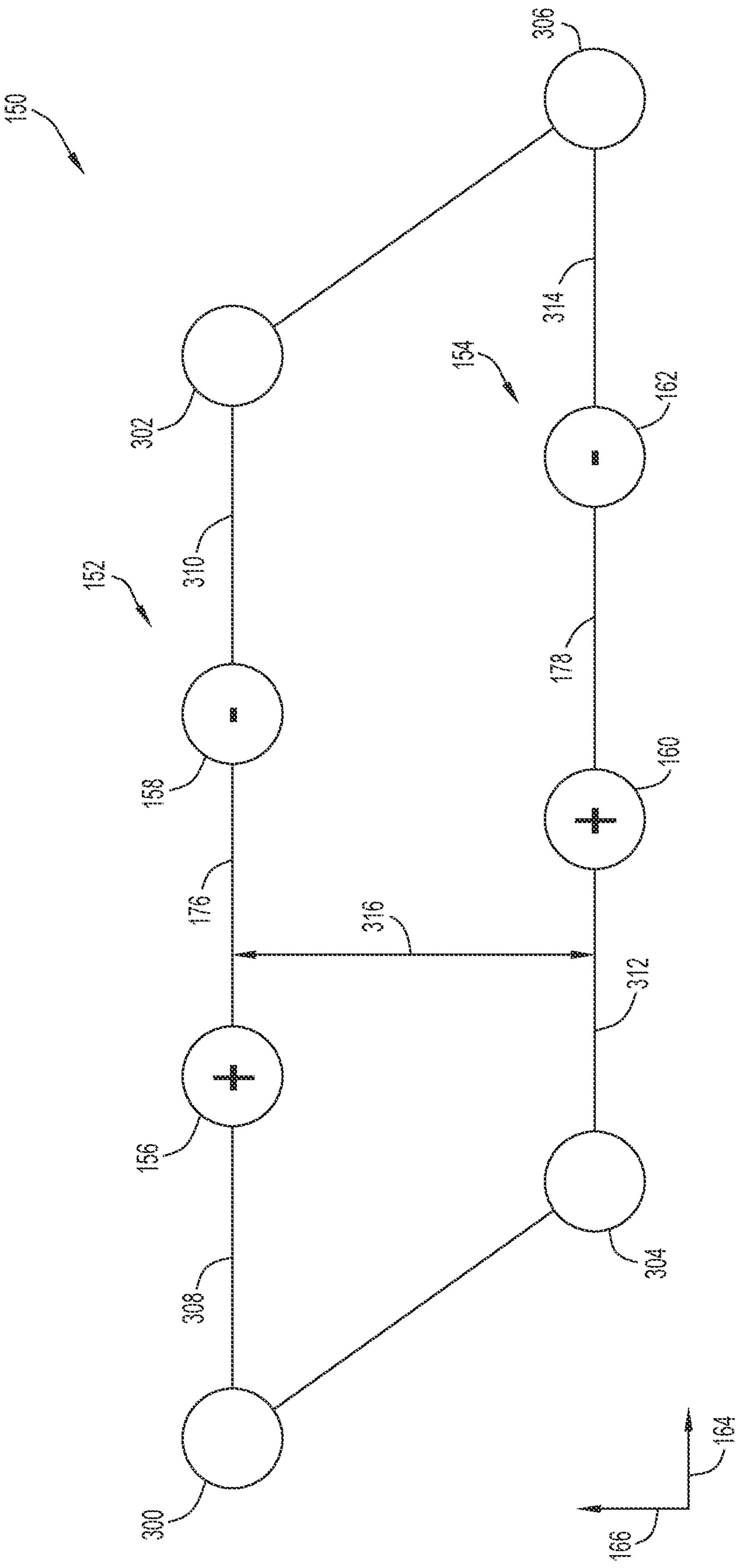
FIG. 5 is a schematic diagram of signal vias and ground vias in an offset arrangement at a PCB layer, according to an example embodiment.

FIG. 5 is a schematic diagram of the layer 150 having the first pair of signal vias 152 and the second pair of signal vias 154. The layer 150 may also include ground vias positioned around the pairs of signal vias 152, 154 to further reduce crosstalk. For example, the ground vias may block emission of electrical fields (e.g., toward other signal vias at the layer 150), thereby isolating the electrical fields emitted by the pairs of signal vias 152, 154 to maintain desirable signal integrity.

The ground vias may include a first ground via 300 positioned adjacent to the first signal via 156, offset from the first signal via 156 along the first axis 164, and aligned with the first signal via 156 along the second axis 166, as well as a second ground via 302 positioned adjacent to the second signal via 158, offset from the second signal via 158 along the first axis 164, and aligned with the second signal via 158 along the second axis 166. For instance, the first ground via 300 may block an electrical field emitted from the first signal via 156, and the second ground via 302 may block an electrical field emitted from the second signal via 158. The ground vias may also include a third ground via 304 positioned adjacent to the third signal via 160, offset from the third signal via 160 along the first axis 164, and aligned with the third signal via 160 along the second axis 166, as well as a fourth ground via 306 positioned adjacent to the fourth signal via 162, offset from the fourth signal via 162 along the first axis 164, and aligned with the fourth signal via 162 along the second axis 166. As such, the third ground via 304 may block an electrical field emitted from the third signal via 160, and the fourth ground via 306 may block an electrical field emitted from the fourth signal via 162.

The first ground via 300 may be positioned at a seventh distance 308 away from the first signal via 156 along the first axis 164, the second ground via 302 may be positioned at an eighth distance 310 away from the first signal via 156 along the first axis 164, the third ground via 304 may be positioned at a ninth distance 312 away from the third signal via 160 along the first axis 164, and the fourth ground via 306 may be positioned at a tenth distance 314 away from the fourth signal via 162 along the first axis 164. In some embodiments, the seventh distance 308, the eighth distance 310, the ninth distance 312, and the tenth distance 314 may be substantially equal to one another. By way of example, the seventh distance 308, the eighth distance 310, the ninth distance 312, and the tenth distance 314 may be substantially equal to the fifth distance 176 and/or the sixth distance 178. Therefore, the third ground via 304 may be offset from the first ground via 300 along the first axis 164 and along the second axis 166, and the fourth ground via 306 may be offset from the second ground via 302 along the first axis 164 and along the second axis 166. In certain embodiments, such a distance may also be substantially equal to an eleventh distance 316 between the first pair of signal vias 152 and the second pair of signal vias 154 along the second axis 166. For instance, each of the distances 176, 178, 308, 310, 312, 314 may be a value between 0.8 mm and 1 mm (e.g., between 0.027 inches to 0.039 inches).

It should be noted that no ground vias may be positioned between the pairs of signal vias 152, 154 along the second axis 166. That is, the offset arrangement between the pairs of signal vias 152, 154 may sufficiently block overlap between the respective electrical fields emitted by one another to maintain a desirable signal integrity without having to implement additional ground vias between the pairs of signal vias 152, 154. As such, the depicted arrangement may reduce or limit a total quantity of ground vias used at the layer 150, such as to have a 1 to 1 ratio between ground vias and signal vias such that each ground via may be dedicated to block electrical fields emitted from a corresponding one of the signal vias. For this reason, a cost associated with manufacture of the layer 150 (e.g., of the ground vias) may be reduced, and/or a space of the layer 150 may be more efficiently utilized (e.g., to position operational components, such as additional signal vias, rather than more components, such as ground vias, dedicated to reducing noise).

Figure 6:
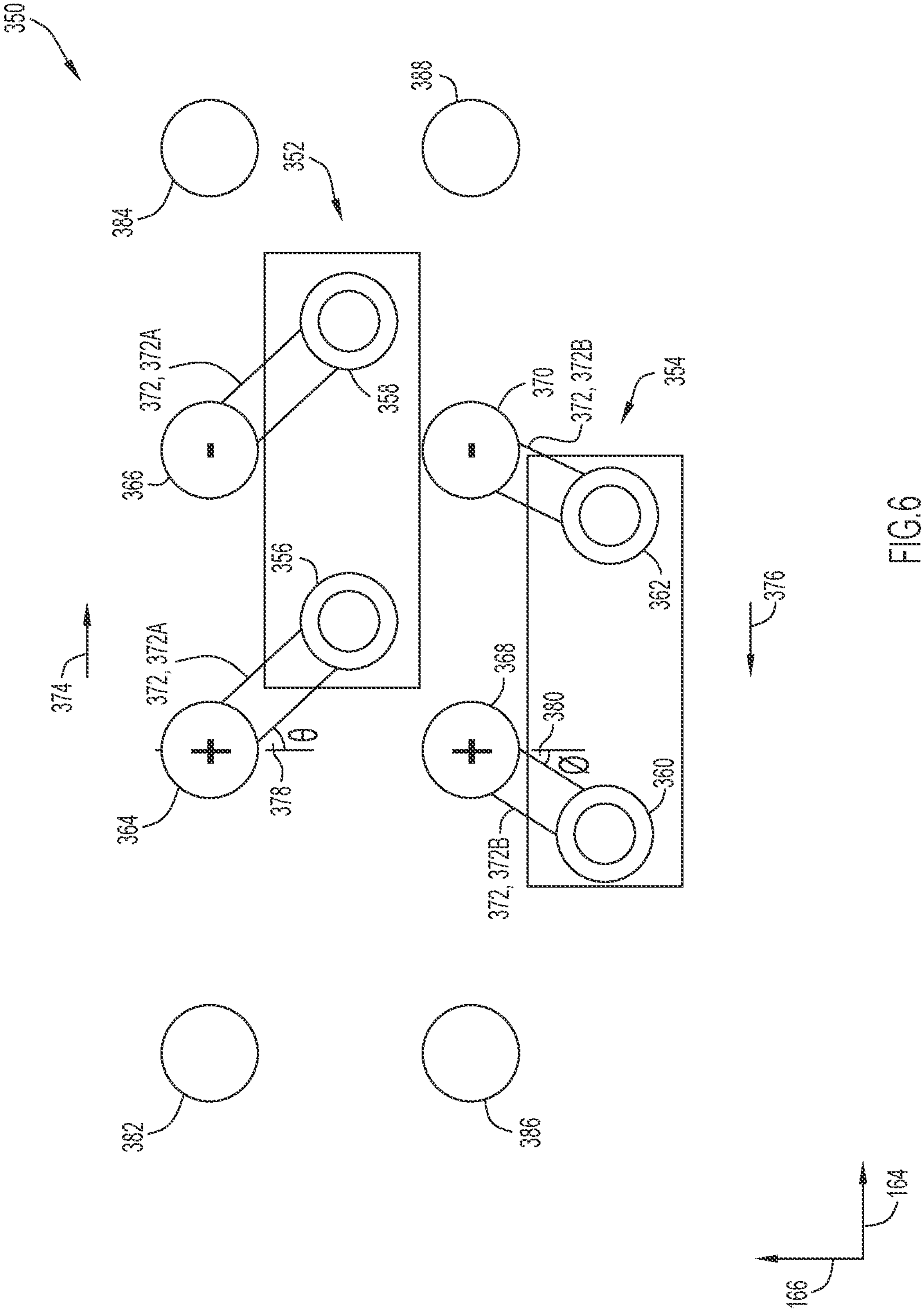
FIG. 6 is a schematic diagram of pins, signal vias, ground vias in an offset arrangement at a PCB layer, according to an example embodiment.

FIG. 6 is a schematic diagram of a layer 350 of another PCB. The layer 350 may include a first pair of signal vias 352 and a second pair of signal vias 354. The first pair of signal vias 352 may include a first signal via 356 and a second signal via 358 offset from one another along the first axis 164 and aligned with one another along the second axis 166. The second pair of signal vias 354 may include a third signal via 360 and a fourth signal via 362 offset from one another along the first axis 164 and aligned with one another along the second axis 166. Moreover, the first pair of signal vias 352 and the second pair of signal vias 354 may be offset from one another along both the first axis 164 and the second axis 166, such as in a similar arrangement as the pairs of signal vias 152, 154 of the layer 150, to reduce crosstalk between the pairs of signal vias 352, 354.

Additionally, the layer 350 may include pads to which the pairs of signal vias 352, 354 are coupled. For instance, the layer 350 may include a first pad 364, a second pad 366, a third pad 368, and a fourth pad 370. Respective traces 372 may couple the first signal via 356 and the first pad 364 to one another, the second signal via 358 and the second pad 366 to one another, the third signal via 360 and the third pad 368 to one another, and the fourth signal via 362 and the fourth pad 370 to one another. As an example, the first pad 364 and the second pad 366 may be offset from one another along the first axis 164 and aligned with one another along the second axis 166, the third pad 368 and the fourth pad 370 may be offset from one another along the first axis 164 and aligned with one another along the second axis 166, the first pad 364 and the third pad 368 may be aligned with one another along the first axis 164 and offset from one another along the second axis 166, and the fourth pad 370 and the second pad 366 may be aligned with one another along the first axis 164 and offset from one another along the second axis 166. In this manner, the pads 364, 366, 368, 370 may form a rectangular (e.g., a square) configuration.

The pads 364, 366, 368, 370 may help couple the signal vias 356, 358, 360, 362 to a separate component, such as an IC (e.g., using a soldering technique). By way of example, the offset arrangement of the signal vias 356, 358, 360, 362 may not be arranged to align with the pins (e.g., pins having pre-established locations that cannot be adjusted) of the separate component. Rather, the pads 364, 366, 368, 370 may be arranged to align with the pins. As such, the pins may be configured to mount to the pads 364, 366, 368, 370, and the traces 372 may then electrically couple the signal vias 356, 358, 360, 362 to the pins by way of the pads 364, 366, 368, 370. Therefore, the pads 364, 366, 368, 370 may enable the pins and the signal vias 356, 358, 360, 362 to electrically couple to one another despite their misaligned arrangements. That is, the pads 364, 366, 368, 370 are arranged to couple to the pins more readily, such as without having to modify the separate component to move the pins and/or utilize an additional, separate adapter component to electrically couple the signal vias 356, 358, 360, 362 to the pins.

The traces 372 may extend (e.g., linearly extend) in different directions for the signal vias 352 and for the signal vias 354. As an example, a first set of traces 372A may extend from the first pad 364 and from the second pad 366 in a first direction 374 along the first axis 164 toward the first signal via 356 and toward the second signal via 358, respectively, whereas a second set of traces 372B may extend from the third pad 368 and from the fourth pad 370 in a second direction 376, opposite the first direction 374, toward the third signal via 360 and toward the fourth signal via 362, respectively. The opposite extension of the first set of traces 372A and the second set of traces 372B along the first axis 164 may enable the pads 364, 366, 368, 370 and the signal vias 356, 358, 360, 362 to be arranged relative to one another in an efficient manner, such as without significantly increasing an outer boundary cooperatively occupied by the pads 364, 366, 368, 370 and signal vias 356, 358, 360, 362. Each of the first set of traces 372A may form a first angle 378 with the second axis 166, and each of the second set of traces 372B may form a second angle 380 with the second axis 166. In some embodiments, the first angle 378 and the second angle 380 may be substantially different from one another. For example, the first angle 378 may be a value between 40 degrees and 50 degrees (e.g., 45 degrees), whereas the second angle 380 may be less than the first angle 378 and may be a value between 25 degrees and 35 degrees (e.g., 30 degrees). However, in alternative embodiments, the first angle 378 may be less than the second angle 380 or the first angle 378 and the second angle 380 may be substantially equal to one another. Moreover, although each of the traces 372 extends in the same direction along the second axis 166 (e.g., in a downward direction) in the illustrated embodiment, in other embodiments, the traces 372 may extend in different directions along the second axis 166. For instance, the first set of traces 372A may extend in a first direction (e.g., a downward direction) along the second axis 166, whereas the second set of traces 372B may extend in a second direction (e.g., an upward direction), opposite the first direction, along the second axis 166. In any case, each of the traces 372 may extend obliquely relative to the first axis 164 and the second axis 166 to arrange the pads 364, 366, 368, 370 and the signal vias 356, 358, 360, 362 in an efficient manner.

The layer 350 may further include a first ground via 382 positioned adjacent to the first pad 364, offset from the first pad 364 along the first axis 164, and aligned with the first pad 364 along the second axis 166; a second ground via 384 positioned adjacent to the second pad 366, offset from the second pad 366 along the first axis 164, and aligned with the second pad 366 along the second axis 166; a third ground via 386 positioned adjacent to the third pad 368, offset from the third pad 368 along the first axis 164, and aligned with the third pad 368 along the second axis 166; and a fourth ground via 388 positioned adjacent to the fourth pad 370, offset from the fourth pad 370 along the first axis 164, and aligned with the fourth pad 370 along the second axis 166. By way of example, the first pad 382 and the third pad 386 may be aligned with one another along the first axis 164 and the second pad 384 and the fourth pad 388 may be aligned with one another along the first axis 164 to form a rectangular configuration. However, in other embodiments, the first pad 382 and the third pad 386 may be offset from one another along the first axis 164, and/or the second pad 384 and the fourth pad 388 may be offset from one another along the first axis 164. In further embodiments, the first ground via 382 may be aligned with the first signal via 356, instead of the first pad 364, along the second axis 166, the second ground via 384 may be aligned with the second signal via 358, instead of the second pad 366, along the second axis 166, the third ground via 386 may be aligned with the third signal via 360, instead of the third pad 368, along the second axis 166, and/or the fourth ground via 388 may be aligned with the fourth via 362, instead of the fourth pad 370, along the second axis 166. In any of these embodiments, the first ground via 382 may block electrical fields emitted by the first signal via 356 and/or by the first pad 364, the second ground via 384 may block electrical fields emitted by the second signal via 358 and/or by the second pad 366, the third ground via 386 may block electrical fields emitted by the third signal via 360 and/or by the third pad 368, and/or the fourth ground via 388 may block electrical fields emitted by the fourth signal via 362 and/or by the third pad 370, thereby isolating such electrical fields (e.g., from other signal vias positioned at the layer 350).

Figure 7:
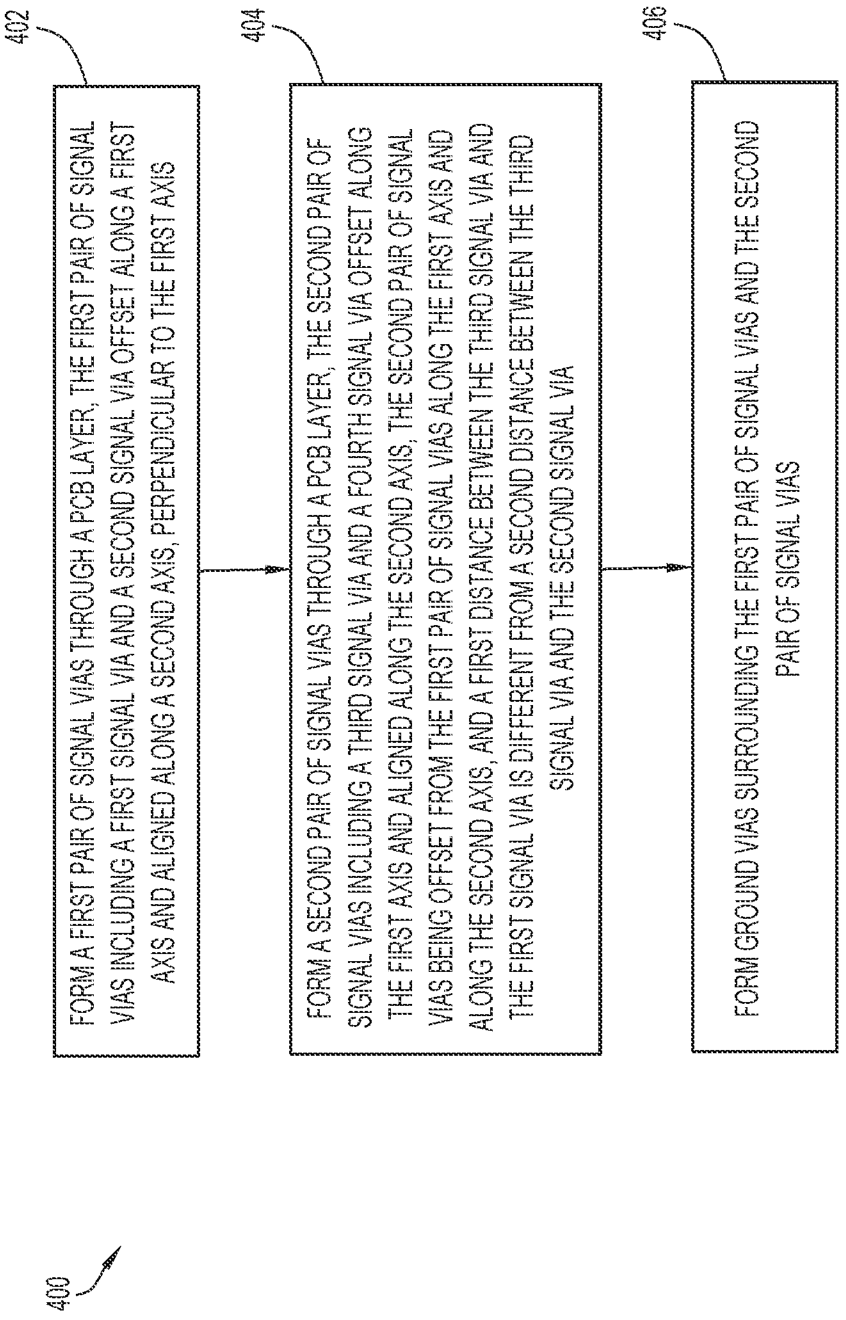
FIG. 7 is a flowchart of a method of manufacturing a PCB layer with signal vias and ground vias, according to an example embodiment.

FIG. 7 is a flowchart of a method 400 of manufacturing a PCB (e.g., the PCB 100), such as any of the layers 102, 150, 350 discussed herein. In certain embodiments, the method 400 may be performed automatically, such as by a processor executing instructions stored on a memory. In additional or alternative embodiments, the method 400 may be performed manually, such as by an operator. It should be noted that the method 400 may be performed differently than depicted. For example, additional operations may be performed, any of the depicted operations may not be performed, and/or the depicted operations may be performed in a different order.

At step 402, a first pair of signal vias may be formed through a layer of a PCB. The first pair of signal vias may include a first signal via and a second signal via offset from one another along a first axis and aligned with one another along a second axis, perpendicular to the first axis. The first signal via and the second signal via may be configured to transmit respective signals. For example, one of the first signal via or the second signal via may be configured to transmit a positive signal, and the other of the first signal via or the second signal via may be configured to transmit a negative signal.

At step 404, a second pair of signal vias may be formed through the layer of the PCB. The second pair of signal vias may include a third signal via and a fourth signal via offset from one another along the first axis and aligned with one another along the second axis. Additionally, the second pair of signal vias may be offset from the first pair of signal vias along the first axis and along the second axis such that a first distance between the third signal via and the first signal via is different from (e.g., greater than) a second distance between the third signal via and the second signal via. For example, an offset distance between the first pair of signal vias and the second pair of signal vias along the first axis may be a value between 0.66 mm and 0.75 mm (e.g., between 0.026 inches and 0.03 inches). Such an offset distance may provide a low overall amount of noise coupling, such as an arrangement in which a first sum of an amount of noise coupling caused by the first signal via with respect to the third signal via and an amount of noise coupling caused by the second signal via with respect to the third signal via is substantially equal to a second sum of an amount of noise coupling caused by the first signal via with respect to the fourth signal via and an amount of noise coupling caused by the second signal via with respect to the fourth signal via. Thus, crosstalk between the pairs of signal vias may be limited.

In certain embodiments, the offset distance to be established may be determined through experimentation, such as in a calibration phase. For instance, in the calibration phase, the positioning of the signal vias may be adjusted by different offset distances, and corresponding amounts of crosstalk (e.g., noise coupling) may be measured for each offset distance. Thus, a particular offset distance providing the lowest measured amount of crosstalk may be determined during the calibration phase. By way of example, the offset distance that provides the lowest measured amount of crosstalk may vary for different implementations having varying operating parameters/conditions. As such, by measuring the amount of crosstalk for different offset distances, a more suitable offset distance providing the lowest measured amount for a particular implementation may be more accurately determined. Different types of crosstalk, such as near end crosstalk in which noise is produced by a generated signal at where signal transmission originates and far end crosstalk in which noise is produced by a transmitted signal at where the transmitted signal is received, may also be measured. In some cases, for a single implementation, a different offset distance may produce the lowest amount of different types of crosstalk (e.g., a first offset distance provides the lowest amount of near end crosstalk, whereas a second offset distance, different from the first offset difference, provides the lowest amount of far end crosstalk). In such cases, an intermediate value, such as a mathematical average, between the different offset distances may be utilized.

At step 406, ground vias surrounding the pairs of signal vias may be formed through the layer of the PCB. By way of example, a first ground via may be positioned adjacent to the first signal via, offset from the first signal via along the first axis, and aligned with the first signal via along the second axis; a second ground via may be positioned adjacent to the second signal via, offset from the second signal via along the first axis, and aligned with the second signal via along the second axis; a third ground via may be positioned adjacent to the third signal via, offset from the third signal via along the first axis, and aligned with the third signal via along the second axis; and a fourth ground via may be positioned adjacent to the fourth signal via, offset from the fourth signal via along the first axis, and aligned with the fourth signal via along the second axis. For instance, the first ground via and the third ground via may be offset from one another along the first axis and along the second axis, and the second ground via and the fourth ground via may be offset from one another along the first axis and along the second axis. The ground vias may block electrical fields emitted by the pairs of signal vias, thereby reducing crosstalk between the pairs of signal vias and other pairs of signal vias at the layer of the PCB.

In some embodiments, the signal vias are configured to electrically couple to pins of a separate component. As an example, the pins of the separate component may be arranged in a similar manner as that of the signal vias. Thus, the signal vias may align with and directly engage with (e.g., using a soldering technique) the pins to electrically couple to the pins. As another example, the pins of the separate component may be arranged in a different manner than that of the signal vias. For this reason, the signal vias may not be able to align with the pins. Instead, pads may be formed at the layer of the PCB and arranged to align with the pins, and respective traces may be formed at the layer of the PCB to electrically couple the pads and signal vias to one another. Therefore, the pads may be configured to couple to the pins (e.g., using a soldering technique), and the pins and signal vias may be electrically coupled to one another by way of the traces and the pads. In either embodiment, the PCB and the separate component may communicate with one another using signals transmitted through the signal vias.

In some aspects, the techniques described herein relate to an apparatus including: a layer of a printed circuit board; a first pair of signal vias formed through the layer, wherein the first pair of signal vias is configured to transmit respective signals, the first pair of signal vias includes a first signal via and a second signal via offset from one another along a first axis and aligned with one another along a second axis, perpendicular to the first axis; and a second pair of signal vias formed through the layer, wherein the second pair of signal vias is configured to transmit respective signals, the second pair of signal vias includes a third signal via and a fourth signal via offset from one another along the first axis and aligned with one another along the second axis, and the first pair of signal vias and the second pair of signal vias are offset from one another along the first axis and along the second axis such that a first distance between the third signal via and the first signal via is different from a second distance between the third signal via and the second signal via.

In some aspects, the techniques described herein relate to an apparatus, wherein the first distance between the third signal via and the first signal via is greater than the second distance between the third signal via and the second signal via.

In some aspects, the techniques described herein relate to an apparatus, wherein the first pair of signal vias and the second pair of signal vias are offset from one another along the first axis and along the second axis such that a first sum of a first amount of noise coupling caused by the first signal via with respect to the third signal via plus a second amount of noise coupling caused by the second signal via with respect to the third signal via is substantially equal to a second sum of a third amount of noise coupling caused by the first signal via with respect to the fourth signal via plus a fourth amount of noise coupling caused by the second signal via with respect to the fourth signal via.

In some aspects, the techniques described herein relate to an apparatus, wherein the first pair of signal vias and the second pair of signal vias are configured to mount to pins of an integrated circuit.

In some aspects, the techniques described herein relate to an apparatus, further including: a plurality of pads formed on the layer of the printed circuit board and configured to mount to pins of an integrated circuit; and a plurality of traces that connects the first signal via, the second signal via, the third signal via, and the fourth signal via to a respective one of the plurality of pads.

In some aspects, the techniques described herein relate to an apparatus, wherein the plurality of traces includes: a first set of traces that connects the first signal via and the second signal via to respective first pads of the plurality of pads, wherein each trace of the first set of traces extends in a first direction along the first axis; and a second set of traces that connects the third signal via and the fourth signal via to respective second pads of the plurality of pads, wherein each trace of the second set of traces extends in a second direction, opposite the first direction, along the first axis.

In some aspects, the techniques described herein relate to an apparatus, wherein an offset distance between the first signal via and the third signal via along the first axis is between 0.66 millimeters and 0.75 millimeters.

In some aspects, the techniques described herein relate to an apparatus, further including a first ground via and a second ground via offset from the first pair of signal vias along the first axis and aligned with the first pair of signal vias along the second axis, wherein a third distance between the first signal via and the first ground via, a fourth distance between the first signal via and the second signal via, and a fifth distance between the second signal via and the second ground via are substantially equal to one another.

In some aspects, the techniques described herein relate to an apparatus including: a layer of a printed circuit board; and a plurality of signal vias formed through the layer and configured to transmit respective signals, wherein the plurality of signal vias includes: a first signal via; a second signal via immediately adjacent to the first signal via along a first axis; a third signal via immediately adjacent to the first signal via along a second axis, perpendicular to the first axis; and a fourth signal via immediately adjacent to the third signal via along the first axis, wherein the first signal via, the second signal via, the third signal via, and the fourth signal via are arranged in a parallelogram configuration, and a first distance between the first signal via and the third signal via is different from a second distance between the second signal via and the third signal via.

In some aspects, the techniques described herein relate to an apparatus, wherein the first distance between the first signal via and the third signal via is greater than the second distance between the second signal via and the third signal via.

In some aspects, the techniques described herein relate to an apparatus, wherein the second distance between the second signal via and the third signal via is less than a third distance between the first signal via and the second signal via.

In some aspects, the techniques described herein relate to an apparatus, wherein the third distance between the first signal via and the second signal via is substantially equal to a fourth distance between the third signal via and the fourth signal via.

In some aspects, the techniques described herein relate to an apparatus, wherein the third distance between the first signal via and the second signal via is substantially equal to a fourth distance between the first signal via and the third signal via along the second axis.

In some aspects, the techniques described herein relate to an apparatus, wherein the third signal via is positioned more adjacent to the second signal via than to the first signal via along the first axis.

In some aspects, the techniques described herein relate to an apparatus including: a layer of a printed circuit board; and a plurality of signal vias formed through the layer and configured to transmit respective signals, wherein the plurality of signal vias includes: a first signal via; a second signal via offset from the first signal via along a first axis and aligned with the first signal via along a second axis, perpendicular to the first axis; a third signal via offset from the first signal via and the second signal via along the first axis and along the second axis; and a fourth signal via offset from the third signal via along the first axis and aligned with the third signal via along the second axis, wherein a first distance between the first signal via and the third signal via, a second distance between the first signal via and the second signal via, and a third distance between the second signal via and the third signal via are different from one another, and the second distance between the first signal via and the second signal via is substantially equal to a fourth distance between the third signal via and the fourth signal via.

In some aspects, the techniques described herein relate to an apparatus, wherein each of the first distance and the second distance is greater than the third distance.

In some aspects, the techniques described herein relate to an apparatus, further including: a plurality of pads formed on the layer of the printed circuit board and configured to mount to pins of an integrated circuit; a first trace that connects the first signal via to a first pad of the plurality of pads; a second trace that connects the third signal via to a second pad of the plurality of pads, wherein the first trace forms a first angle with the second axis, and the second trace forms a second angle, different from the first angle, with the second axis.

In some aspects, the techniques described herein relate to an apparatus, wherein the second angle is less than the first angle.

In some aspects, the techniques described herein relate to an apparatus, further including: a fifth signal via offset from the first signal via and the third signal via along the second axis and aligned with the first signal via along the first axis; and a sixth signal via offset from the second signal via and the fourth signal via along the second axis and aligned with the second signal via along the first axis.

In some aspects, the techniques described herein relate to an apparatus, wherein the first signal via and the second signal via are a first differential pair, and the third signal via and the fourth signal via are a second differential pair.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the' (s)' nomenclature (e.g., one or more element(s)).

As used herein, the terms "approximately," "generally," "substantially," and so forth, are intended to convey that the property value being described may be within a relatively small range of the property value, as those of ordinary skill would understand. For example, when a property value is described as being "approximately" equal to (or, for example, "substantially similar" to) a given value, this is intended to convey that the property value may be within +/−5%, within +/−4%, within +/−3%, within +/−2%, within +/−1%, or even closer, of the given value. Similarly, when a given feature is described as being "substantially parallel" to another feature, "generally perpendicular" to another feature, and so forth, this is intended to convey that the given feature is within +/−5%, within +/−4%, within +/−3%, within +/−2%, within +/−1%, or even closer, to having the described nature, such as being parallel to another feature, being perpendicular to another feature, and so forth. Mathematical terms, such as "parallel" and "perpendicular," should not be rigidly interpreted in a strict mathematical sense, but should instead be interpreted as one of ordinary skill in the art would interpret such terms. For example, one of ordinary skill in the art would understand that two lines that are substantially parallel to each other are parallel to a substantial degree, but may have minor deviation from exactly parallel.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . or "step for [perform]ing [a function] . . . ", it is intended that such elements are to be interpreted under 35 U.S.C. 112 (f). However, for any claims containing elements designated in any other manner, it is intended that such elements are not to be interpreted under 35 U.S.C. 112 (f).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:

a layer of a printed circuit board;

a first pair of signal vias formed through the layer, wherein the first pair of signal vias is configured to transmit respective signals, the first pair of signal vias comprises a first signal via and a second signal via offset from one another along a first axis and aligned with one another along a second axis, perpendicular to the first axis;

a second pair of signal vias formed through the layer, wherein the second pair of signal vias is configured to transmit respective signals, the second pair of signal vias comprises a third signal via and a fourth signal via offset from one another along the first axis and aligned with one another along the second axis, and the first pair of signal vias and the second pair of signal vias are offset from one another along the first axis and along the second axis such that a first distance between the third signal via and the first signal via is different from a second distance between the third signal via and the second signal via;

a plurality of pads formed on the layer of the printed circuit board and configured to mount to pins of an integrated circuit;

a first set of traces that connects the first signal via and the second signal via to respective first pads of the plurality of pads, wherein each trace of the first set of traces forms a first angle between 40 degrees and 50 degrees with respect to the second axis; and a second set of traces that connects the third signal via and the fourth signal via to respective second pads of the plurality of pads, wherein each trace of the second set of traces forms a second angle between 25 degrees and 35 degrees with respect to the second axis.

2. The apparatus of claim 1, wherein the first distance between the third signal via and the first signal via is greater than the second distance between the third signal via and the second signal via.

3. The apparatus of claim 1, wherein the first pair of signal vias and the second pair of signal vias are offset from one another along the first axis and along the second axis such that a first sum of a first amount of noise coupling caused by the first signal via with respect to the third signal via plus a second amount of noise coupling caused by the second signal via with respect to the third signal via is substantially equal to a second sum of a third amount of noise coupling caused by the first signal via with respect to the fourth signal via plus a fourth amount of noise coupling caused by the second signal via with respect to the fourth signal via.

4. The apparatus of claim 1, wherein the first pair of signal vias and the second pair of signal vias are configured to mount to pins of the integrated circuit.

5. The apparatus of claim 1, wherein the plurality of pads is arranged in a rectangular configuration.

6. The apparatus of claim 1, wherein each trace of the first set of traces extends in a first direction along the first axis; and wherein each trace of the second set of traces extends in a second direction, opposite the first direction, along the first axis.

7. The apparatus of claim 1, wherein an offset distance between the first signal via and the third signal via along the first axis is between 0.66 millimeters and 0.75 millimeters.

8. The apparatus of claim 1, further comprising a first ground via and a second ground via offset from the first pair of signal vias along the first axis and aligned with the first pair of signal vias along the second axis, wherein a third distance between the first signal via and the first ground via, a fourth distance between the first signal via and the second signal via, and a fifth distance between the second signal via and the second ground via are substantially equal to one another.

9. An apparatus comprising:

a layer of a printed circuit board; and a plurality of signal vias formed through the layer and configured to transmit respective signals, wherein the plurality of signal vias comprises:

a first signal via;

a second signal via immediately adjacent to the first signal via along a first axis;

a third signal via immediately adjacent to the first signal via along a second axis, perpendicular to the first axis;

a fourth signal via immediately adjacent to the third signal via along the first axis, wherein the first signal via, the second signal via, the third signal via, and the fourth signal via are arranged in a parallelogram configuration, and a first distance between the first signal via and the third signal via is different from a second distance between the second signal via and the third signal via;

a plurality of pads formed on the layer of the printed circuit board and configured to mount to pins of an integrated circuit;

a first plurality of traces that connects the first signal via and the second signal via to respective first pads of the plurality of pads, wherein each trace of the first plurality of traces forms a first angle between 40 degrees and 50 degrees with respect to the second axis; and a second plurality of traces that connects the third signal via and the fourth signal via to respective second pads of the plurality of pads, wherein each trace of the second plurality of traces forms a second angle between 25 degrees and 35 degrees with respect to the second axis to arrange the first pads and the second pads in a rectangular configuration.

10. The apparatus of claim 9, wherein the first distance between the first signal via and the third signal via is greater than the second distance between the second signal via and the third signal via.

11. The apparatus of claim 9, wherein the second distance between the second signal via and the third signal via is less than a third distance between the first signal via and the second signal via.

12. The apparatus of claim 11, wherein the third distance between the first signal via and the second signal via is substantially equal to a fourth distance between the third signal via and the fourth signal via.

13. The apparatus of claim 11, wherein the third distance between the first signal via and the second signal via is substantially equal to a fourth distance between the first signal via and the third signal via along the second axis.

14. The apparatus of claim 9, wherein the third signal via is positioned more adjacent to the second signal via than to the first signal via along the first axis.

15. An apparatus comprising:

a layer of a printed circuit board; and a plurality of signal vias formed through the layer and configured to transmit respective signals, wherein the plurality of signal vias comprises:

a first signal via;

a second signal via offset from the first signal via along a first axis and aligned with the first signal via along a second axis, perpendicular to the first axis;

a third signal via offset from the first signal via and the second signal via along the first axis and along the second axis;

a fourth signal via offset from the third signal via along the first axis and aligned with the third signal via along the second axis;

a plurality of pads formed on the layer of the printed circuit board and configured to mount to pins of an integrated circuit;

a first trace connecting the first signal via to a first pad of the plurality of pads to form a first angle between 40 degrees and 50 degrees with the second axis;

a second trace connecting the second signal via to a second pad of the plurality of pads to form the first angle between 40 degrees and 50 degrees with the second axis;

a third trace connecting the third signal via to a third pad of the plurality of pads to form a second angle between 25 degrees and 35 degrees with the second axis; and a fourth trace connecting the fourth signal via to a fourth pad of the plurality of pads to form the second angle between 25 degrees and 35 degrees with the second axis, wherein a first distance between the first signal via and the third signal via, a second distance between the first signal via and the second signal via, and a third distance between the second signal via and the third signal via are different from one another, the second distance between the first signal via and the second signal via is substantially equal to a fourth distance between the third signal via and the fourth signal via.

16. The apparatus of claim 15, wherein each of the first distance and the second distance is greater than the third distance.

17. The apparatus of claim 15, wherein the plurality of pads is in a rectangular configuration.

18. The apparatus of claim 15, wherein the first trace and the second trace extend in a first direction along the first axis, and the third trace and the fourth trace extend in a second direction, opposite the first direction, along the first axis.

19. The apparatus of claim 15, further comprising:

a fifth signal via offset from the first signal via and the third signal via along the second axis and aligned with the first signal via along the first axis; and a sixth signal via offset from the second signal via and the fourth signal via along the second axis and aligned with the second signal via along the first axis.

20. The apparatus of claim 15, wherein the first signal via and the second signal via are a first differential pair, and the third signal via and the fourth signal via are a second differential pair.

* * * * *